United States Patent
Ju

(10) Patent No.: US 8,070,505 B2
(45) Date of Patent: Dec. 6, 2011

(54) ELECTRICAL CONNECTING DEVICE

(75) Inventor: Ted Ju, Keelung (TW)

(73) Assignee: Lotes Co., Ltd., Keelung (TW)

( * ) Notice: Subject to any disclaimer, the term of this patent is extended or adjusted under 35 U.S.C. 154(b) by 0 days.

(21) Appl. No.: 12/786,820

(22) Filed: May 25, 2010

(65) Prior Publication Data

US 2011/0177701 A1  Jul. 21, 2011

(30) Foreign Application Priority Data

Jan. 18, 2010 (CN) .......................... 2010 2 0026914

(51) Int. Cl.
*H01R 13/625* (2006.01)
(52) U.S. Cl. ....................................................... 439/342
(58) Field of Classification Search .................. 439/342, 439/343
See application file for complete search history.

(56) References Cited

U.S. PATENT DOCUMENTS

2003/0224648 A1* 12/2003 Cheng ........................... 439/342
2005/0020118 A1* 1/2005 Norris et al. .................. 439/342

* cited by examiner

*Primary Examiner* — Ross Gushi
(74) *Attorney, Agent, or Firm* — Muncy, Geissler, Olds & Lowe, PLLC

(57) ABSTRACT

An electrical connecting device is disclosed and includes a printed circuit board, an electrical connector, and a fixing gum. The electrical connector is used for electrically connecting a chip module onto the printed circuit board and has at least one gum positioning portion formed on at least one sidewall thereof. The gum positioning portion is non-coplanar with respect to the sidewall. The fixing gum adheres between and to the recess and the printed circuit board and is also attached in the recess. Because the gum positioning portion of the electrical connector is non-coplanar with respect to the sidewall, after the fixing gum is sprayed on the gum positioning portion, the electrical connector is reliably mounted on the printed circuit board to be prevented from falling off under an external force during a reflowing or due to shaking.

20 Claims, 4 Drawing Sheets

ELECTRICAL CONNECTING DEVICE

BACKGROUND OF THE INVENTION

1. Field of the Invention

This invention relates to an electrical connecting device, and more particularly, relates to an electrical connecting device for electrically connecting a chip module onto a circuit board.

2. Description of the Prior Art

In the industry, an electrical connector is soldered with tin on a printed circuit board. However, for some electrical connectors (e.g. sockets), because they have a lot of soldering points, void soldering and weak soldering often appear when soldering. In this case, a re-soldering is usually required, that is, the soldered electrical connector is put back to a reflow furnace for reflowing. The heating temperature for the reflowing is the same as the melting point of the soldered tin in the soldering of the electrical connector on the printed circuit board. It is unavoidable to sustain an external force due to shaking in the reflowing. Consequently, the soldered tin in the reflowing is melted, and the electrical connector may sustain an external force due to shaking. The electrical connector may therefore fall from the printed circuit board.

Especially in a case that the printed circuit board needs to be soldered with an electrical connector on each of two sides thereof for the production requirement, first, one electrical connector is soldered on one side of the printed circuit board, and then, the other electrical connector is soldered on the other side of the printed circuit board. For the first-soldered electrical connector (e.g. socket), the weight thereof is heavier. During the soldering of the other electrical connector on the other side of the printed circuit board, the melting point of the soldered tin for soldering the first-soldered electrical connector on the printed circuit board is the same as the heating temperature for soldering the other electrical connector on the other side of the printed circuit board, so the first-soldered electrical connector (e.g. socket) is easy to being dis-soldered so as to fall due to the effect of its gravity.

Therefore, there is a need to improve the electrical connecting device for solving the above disadvantages.

SUMMARY OF THE INVENTION

For the problems encountered in the prior art, a purpose of the invention is to solve the problems that the electrical connector (especially electrical connector with a lot of soldering points) of the electrical connecting device in the prior art is easy to have void soldering during the soldering and falls down during the reflowing, so as to provide an electrical connecting device preventing the electrical connector from falling.

To realize the above purpose, the technical solution adopted by the invention is to provide an electrical connecting device, which includes a printed circuit board and an electrical connector. The electrical connector is electrically connected to the printed circuit board and has at least one gum positioning portion formed on at least one sidewall thereof. The gum positioning portion is non-coplanar with respect to the sidewall.

In a preferred embodiment, the gum positioning portion is a recess. The electrical connector has the recess on each of opposite sidewalls thereof. Two of the recesses are formed on each of the sidewalls.

In a preferred embodiment, the electrical connector is soldered on the printed circuit board with tin. A fixing gum is attached on the gum positioning portion. The melting point of the fixing gum is higher than the melting point of the tin for soldering the electrical connector on the printed circuit board.

Compared with the prior art, the invention has the following advantages.

1. By forming at least one gum positioning portion on at least one sidewall of the electrical connector, after the electrical connector is soldered on the printed circuit board, the fixing gum is sprayed on the gum positioning portion to connect the electrical connector with the printed circuit board. Because the gum positioning portion is a holding platform non-coplanar with respect to the sidewall, the fixing gum is mounted on the gum positioning portion reliably. Besides, the melting point of the fixing gum is higher than the melting point of the tin for soldering the electrical connector on the printed circuit board, so the electrical connector will not fall off during the reflowing due to void soldering even though the heating temperature is the same as the melting point of the tin.

2. Because two of the recesses are formed on each of the opposite sidewalls of the electrical connector, the electrical connector can be firmly mounted on the printed circuit board after spraying the fixing gum. It prevents the electrical connector from buckling in the reflowing due to only one side of the electrical connector being mounted by spraying the fixing gum.

The advantage and spirit of the invention may be understood by the following recitations together with the appended drawings.

BRIEF DESCRIPTION OF THE APPENDED DRAWINGS

DETAILED DESCRIPTION OF THE INVENTION

Figure 2:
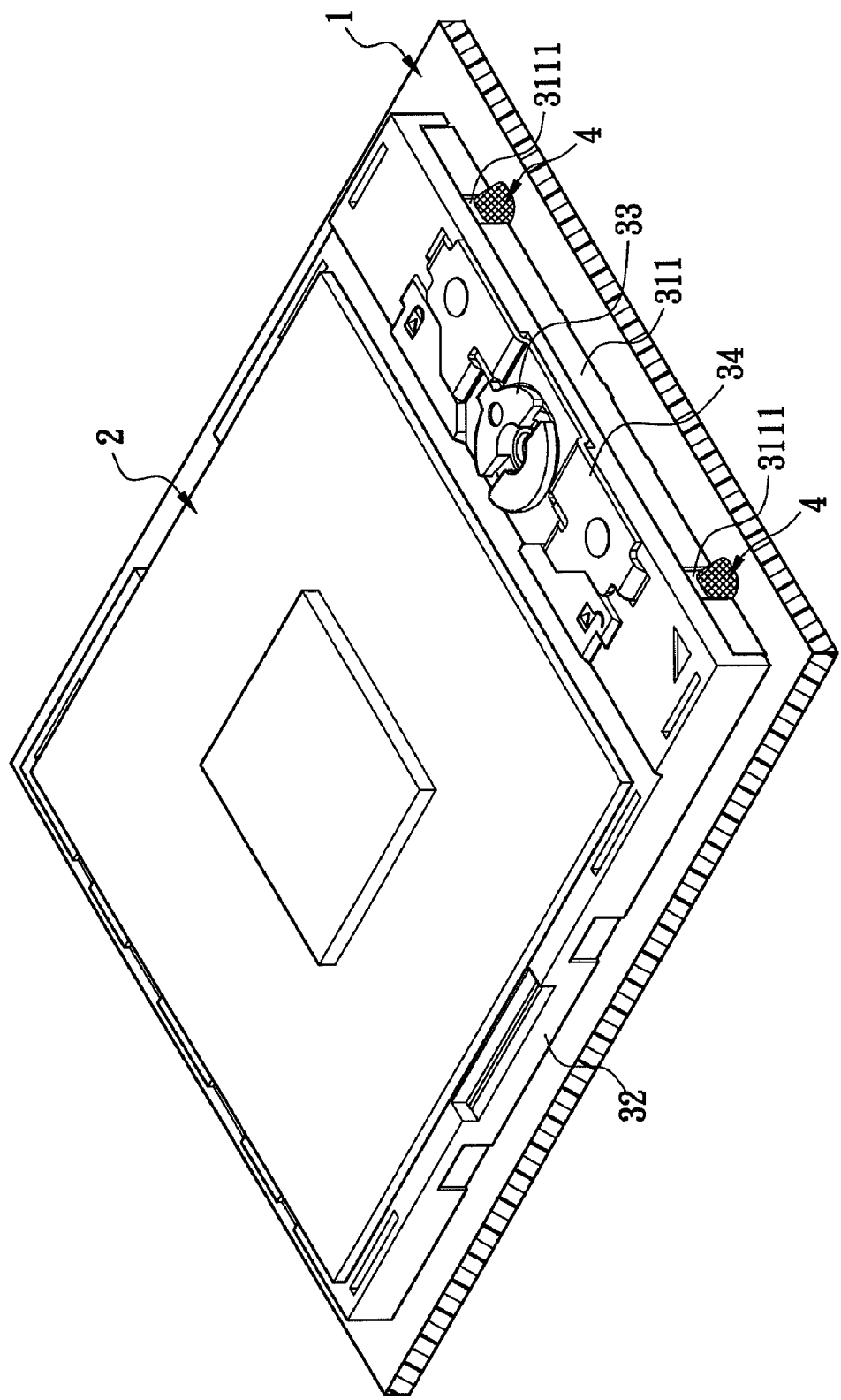
FIG. 2 is a pictorial assembly drawing of the electrical connecting device of the invention.
Figure 3:
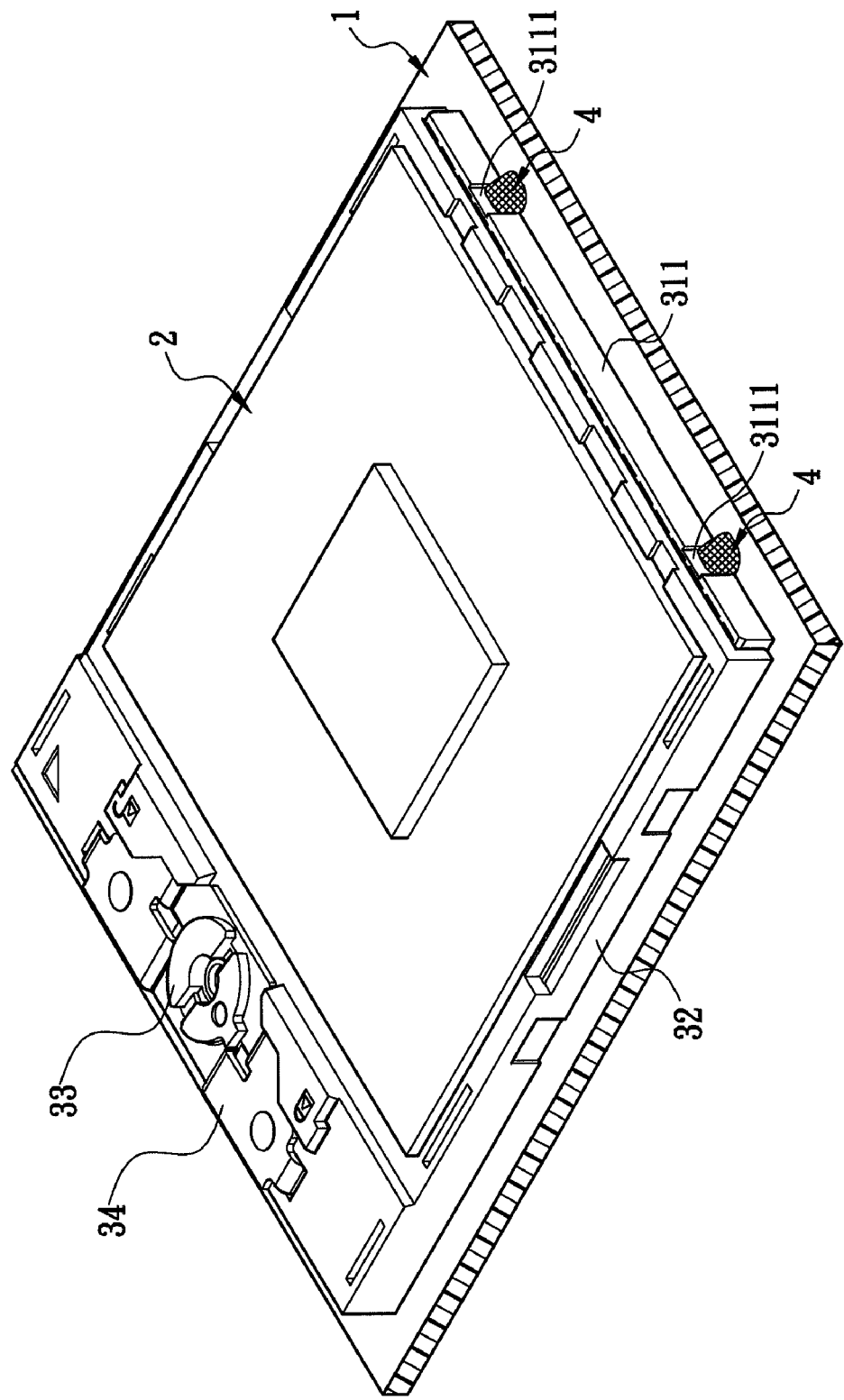
FIG. 3 is a pictorial assembly drawing of the electrical connecting device with another view.
Figure 4:
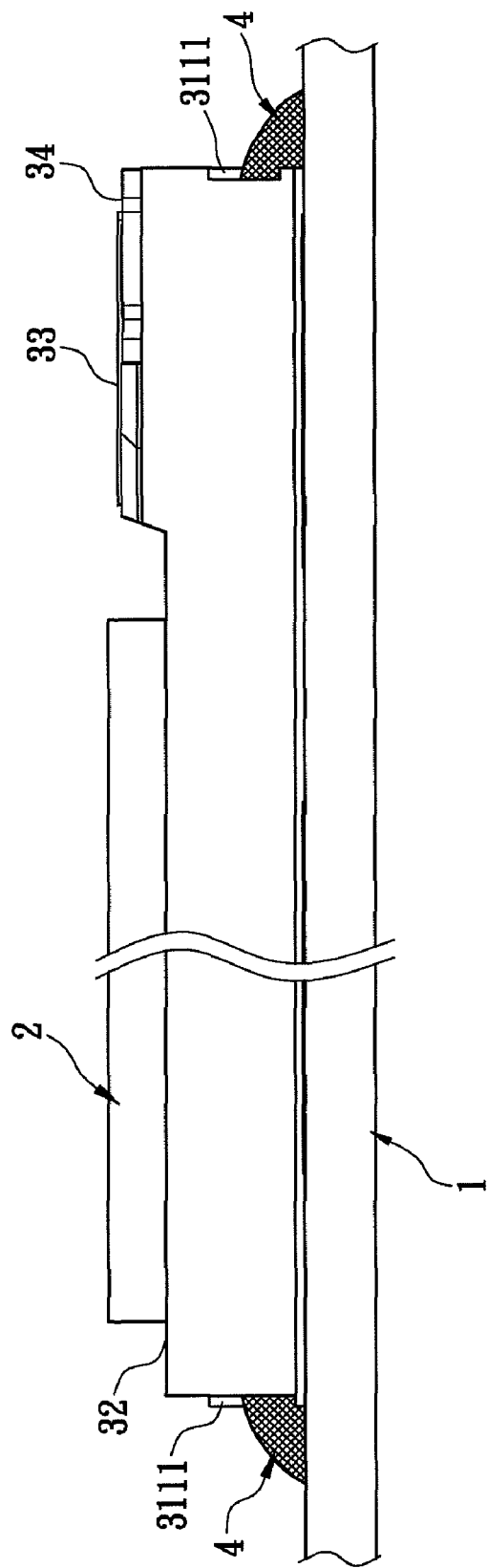
FIG. 4 is a side view of the electrical connecting device in FIG. 2.

Please refer to FIGS. 2 through 4. An electrical connecting device of the invention includes a printed circuit board 1, a chip module 2, and an electrical connector 3.

Figure 1:
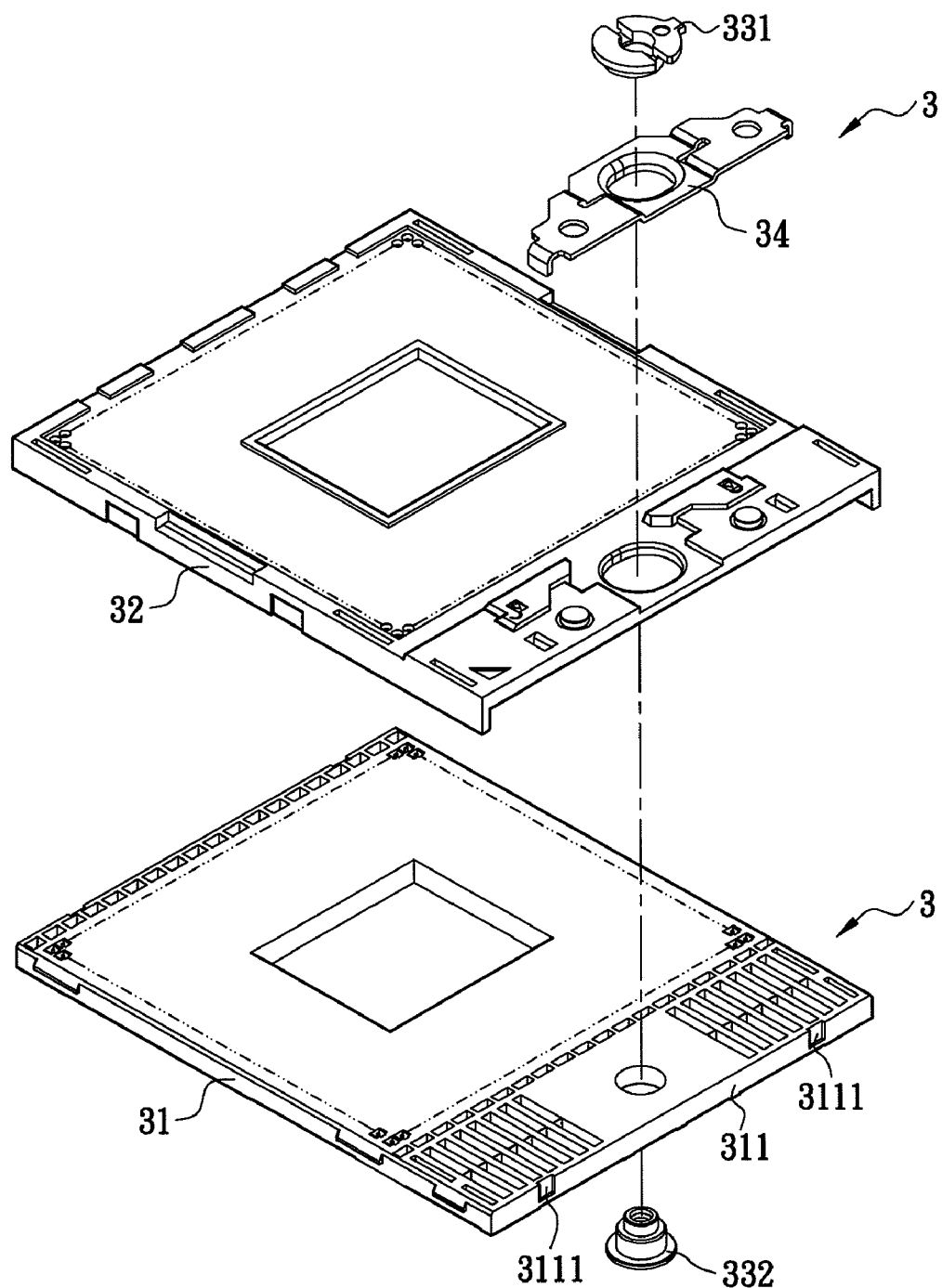
FIG. 1 is an exploded drawing of an electrical connecting device of the invention.

As shown in FIG. 1, the electrical connector 3 is used to connect the chip module 2 on the printed circuit board 1 electrically. The electrical connector 3 includes an electrical connecting socket 31, a cover 32, a connecting member for driving the cover to move with respect to the electrical connecting socket 31, and a strengthening sheet 34.

Each of two opposite sidewalls 311 of the electrical connecting socket 31 forms two gum positioning portions thereon. In the embodiment, the gum positioning portion is a recess 3111. Of course, in other embodiments, the gum positioning portion could be a protrusion or an incline, as long as the gum positioning portion is non-coplanar with respect to the sidewall 311.

The cover 32 is disposed above the electrical connecting socket 31.

In the embodiment, the connecting member is a cam mechanism 33 (or could be a lever in other embodiments) and includes a driving portion 331 and a rotational portion 332. The cover 32 is driven by the driving portion 331 and the rotational portion 332 to move back and forth with respect to the electrical connecting socket 31.

The strengthening sheet 34 is disposed between the cover 32 and the cam mechanism 33 to enhance the strength of the cover 32.

Please refer to FIGS. 2 through 4. For the electrical connecting device of the invention, when soldering, the printed circuit board 1 is coated with tin paste thereon. Next, the electrical connector 3 is soldered on the printed circuit board 1. Then, a fixing gum 4 is sprayed (of course, or dropped by other ways) onto the recess 3111 and flows onto the printed circuit board 1, so as to mount the electrical connector 3 on the printed circuit board 1 firmly. The melting point of the fixing gum 4 is higher than the melting point of the tin for soldering the electrical connector 3 on the printed circuit board 1. If the electrical connector 3 is required to be soldered secondarily because of void soldering, the soldered electrical connector 3 will be put back to a reflow furnace to reflow. At this case, the heating temperature inside the reflow furnace is substantially the same as the melting point of the tin used in the first soldering. Because the two opposite sidewalls 311 of the electrical connecting socket 31 have been mounted on the printed circuit board 1 by the fixing gum 4, and the melting point of the fixing gum 4 is higher than the melting point of the tin for soldering the electrical connector 3 on the printed circuit board 1, the fixing gum 4, is not melt, so as to mount the electrical connector 3 on the printed circuit board 1 firmly. Therefore, even though the electrical connectors 3 need to be soldered on each side of the printed circuit board by the production requirement or others, the electrical connector 3 will not fall down due to gravity thereof or dis-adhering of the fixing gum 4 when the first-soldered electrical connector 3 is disposed downwards.

Therefore, compared with the prior art, the electrical connecting device of the invention has the following advantages.

1. By forming at least one recess on at least one sidewall of the electrical connector, after the electrical connector is soldered on the printed circuit board, the fixing gum is sprayed on the recess to connect the electrical connector with the printed circuit board. Because the recess is a holding platform non-coplanar with respect to the sidewall, the fixing gum is mounted reliably on the recess so that the electrical connector is mounted firmly and positioned on the printed circuit board through the dual-fixing of tin soldering and the fixing gum.

2. The melting point of the fixing gum is higher than the melting point of the tin for soldering the electrical connector on the printed circuit board, so the fixing gum is not melt even though the heating temperature is the same as the melting point of the tin. Therefore, the electrical connector will not fall down even under the effect of an external force due to gravity or shaking.

3. Because two of the recesses are formed on each of the opposite sidewalls of the electrical connector, the fixing gum can mount the electrical connector on the printed circuit board firmly after being sprayed. It prevents the electrical connector from buckling in the reflowing due to only one side of the electrical connector being mounted by spraying the fixing gum.

With the example and explanations above, the features and spirits of the invention will be hopefully well described. Those skilled in the art will readily observe that numerous modifications and alterations of the device may be made while retaining the features and spirit of the invention. Accordingly, the above disclosure should be construed as limited only by the metes and bounds of the appended claims.

What is claimed is:

1. An electrical connecting device, comprising:
   a printed circuit board;
   an electrical connector, connected electrically to the printed circuit board, the electrical connector having at least one gum positioning portion formed on at least one sidewall thereof, the gum positioning portion being non-coplanar with respect to the sidewalk;
   a fixing gum is attached on the gum positioning portion.

2. The electrical connecting device of claim 1, wherein the gum positioning portion is a recess.

3. The electrical connecting device of claim 2, wherein the electrical connector has the recess on each of opposite sidewalls thereof.

4. The electrical connecting device of claim 2, wherein the electrical connector has two of the recesses on each of opposite sidewalls thereof.

5. The electrical connecting device of claim 1, wherein the gum positioning portion is a protrusion.

6. The electrical connecting device of claim 5, wherein the electrical connector has two of the protrusions on each of opposite sidewalls thereof.

7. The electrical connecting device of claim 1, wherein the electrical connector is used for electrically connecting a chip module onto the printed circuit board.

8. The electrical connecting device of claim 1, wherein the electrical connector is soldered on the printed circuit board with tin.

9. The electrical connecting device of claim 8, wherein the melting point of the fixing gum is higher than the melting point of the tin for soldering the electrical connector on the printed circuit board.

10. The electrical connecting device of claim 1, wherein the electrical connector comprises an electrical connecting socket, a cover, and a connecting member that driving the cover to move with respect to the electrical connecting socket.

11. The electrical connecting device of claim 10, wherein the gum positioning portion is disposed on at least one sidewall of the electrical connecting socket.

12. An electrical connecting device, comprising:
    a printed circuit board;
    an electrical connector, electrically connected to the printed circuit board, the electrical connector having at least one recess formed on at least one sidewall thereof; and
    a fixing gum, adhering between and to the recess and the printed circuit board, and being also attached in the recess.

13. The electrical connecting device of claim 12, wherein the electrical connector has the recess on each of opposite sidewalls thereof.

14. The electrical connecting device of claim 12, wherein the electrical connector has two of the recesses on each of the opposite sidewalls thereof.

15. The electrical connecting device of claim 12, wherein the electrical connector is used for electrically connecting a chip module onto the printed circuit board.

16. The electrical connecting device of claim 12, wherein the electrical connector is soldered on the printed circuit board with tin.

17. The electrical connecting device of claim 16, wherein the melting point of the fixing gum is higher than the melting point of the tin for soldering the electrical connector on the printed circuit board.

18. The electrical connecting device of claim 12, wherein the electrical connector comprises an electrical connecting socket, a cover, and a connecting member that driving the cover to move with respect to the electrical connecting socket.

19. The electrical connecting device of claim 18, wherein the recess is disposed on at least one sidewall of the electrical connecting socket.

20. The electrical connecting device of claim 18, wherein the recess is disposed on each of opposite sidewalls of the electrical connecting socket.

* * * * *